US011112606B2

(12) United States Patent
Percival et al.

(10) Patent No.: US 11,112,606 B2
(45) Date of Patent: Sep. 7, 2021

(54) MULTIPLE LAYER PROJECTOR FOR A HEAD-MOUNTED DISPLAY

(71) Applicant: Facebook Technologies, LLC, Menlo Park, CA (US)

(72) Inventors: Christopher Percival, Blarney (IE); Yusufu Njoni Bamaxam Sulai, Bothell, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/130,973

(22) Filed: Sep. 13, 2018

(65) Prior Publication Data

US 2019/0086669 A1 Mar. 21, 2019

Related U.S. Application Data

(60) Provisional application No. 62/561,154, filed on Sep. 20, 2017.

(51) Int. Cl.
*G02B 27/01* (2006.01)
*H01L 27/15* (2006.01)
(Continued)

(52) U.S. Cl.
CPC ......... *G02B 27/0172* (2013.01); *G06F 3/012* (2013.01); *G06F 3/013* (2013.01); *H01L 25/0753* (2013.01); *H01L 27/156* (2013.01); *H01L 25/167* (2013.01); *H01L 33/20* (2013.01); *H01L 33/385* (2013.01); *H01L 33/44* (2013.01)

(58) Field of Classification Search
CPC ..... G02B 27/0172; G06F 3/012; G06F 3/013; H01L 25/0753; H01L 27/156; H01L 33/44; H01L 25/167; H01L 33/385; H01L 33/20
See application file for complete search history.

(56) References Cited

U.S. PATENT DOCUMENTS 9,213,185 B1 12/2015 Starner et al.
9,337,406 B2 5/2016 Yin et al.
(Continued)

FOREIGN PATENT DOCUMENTS

| EP | 3179289 A1 | 6/2017 |
|---|---|---|
| WO | WO 2011/133140 A2 | 10/2011 |
| WO | WO 2016/105521 A1 | 6/2016 |

OTHER PUBLICATIONS

PCT International Search Report and Written Opinion, PCT Application No. PCT/US2018/050966, dated Jan. 28, 2019, 16 pages.
(Continued)

*Primary Examiner* — Mark W Regn
(74) *Attorney, Agent, or Firm* — Fenwick & West LLP

(57) ABSTRACT

A head-mounted display (HMD) including multiple layered display panels. The HMD may include a first display panel to display a first image, and a second display panel positioned in front of the first display panel to at least partially overlap with the first display panel. The second display panel may include a display substrate, and a plurality of light emitting diodes (LEDs) positioned on the display substrate. The plurality of LEDs display a second image. The display substrate and the plurality of LEDs are transparent for the first image to be visible through the second display panel.

18 Claims, 10 Drawing Sheets

(51) Int. Cl.
*G06F 3/01* (2006.01)
*H01L 25/075* (2006.01)
*H01L 33/20* (2010.01)
*H01L 33/38* (2010.01)
*H01L 25/16* (2006.01)
*H01L 33/44* (2010.01)

(56) References Cited

U.S. PATENT DOCUMENTS

| | | |
|---|---|---|
| 2007/0009222 A1 | 1/2007 | Jae-Phil et al. |
| 2010/0060553 A1* | 3/2010 | Zimmerman ....... H01L 25/0753 345/60 |
| 2011/0001768 A1 | 1/2011 | Chen-Nan et al. |
| 2013/0063817 A1 | 3/2013 | Santori et al. |
| 2013/0241805 A1* | 9/2013 | Gomez .................. G06F 3/013 345/8 |
| 2015/0179904 A1 | 6/2015 | Pleun et al. |
| 2016/0233269 A1 | 8/2016 | Wai et al. |
| 2016/0240118 A1 | 8/2016 | Alexander et al. |
| 2016/0255011 A1 | 9/2016 | Karino et al. |
| 2016/0260258 A1* | 9/2016 | Lo ...................... G02B 27/0172 |
| 2016/0343315 A1* | 11/2016 | Richards ................. G09G 3/20 |
| 2016/0370855 A1* | 12/2016 | Lanier .................... G06F 3/013 |
| 2017/0236807 A1 | 8/2017 | Hwang et al. |
| 2017/0343315 A1 | 11/2017 | Beaty et al. |

OTHER PUBLICATIONS

European Patent Office, Extended European Search Report, European Patent Application No. 18195758.0, dated Feb. 4, 2019, eight pages.

Chinese Patent Office, Office Action, Chinese Patent Application No. 201880061459.9, dated Jun. 2, 2021, 10 pages, (with concise explanation of relevance).

* cited by examiner

MULTIPLE LAYER PROJECTOR FOR A HEAD-MOUNTED DISPLAY

CROSS REFERENCE TO RELATED APPLICATION

This application claims the benefit under 35 U.S.C. § 119(e) to U.S. Provisional Application No. 62/561,154, titled "Multiple Layer Projector for a Head-Mounted Display," filed Sep. 20, 2017, which is incorporated by reference in its entirety.

BACKGROUND

The present disclosure generally relates to electronic displays, and specifically to electronic displays with multiple displays panels in head-mounted displays (HMDs).

Head-mounted displays (HMDs) may be used to present augmented and/or virtual information to a user. For example, a virtual reality (VR) headset can be used to simulate virtual environments. Conventionally, a HMD presents stereoscopic images on an electronic display inside the HMD to simulate the illusion of depth. However, conventional HMDs are often unable to compensate for vergence and accommodation conflict when rendering content, which may cause double vision, visual fatigue, and nausea in users. It is desirable in HMDs for the focal depth of an image presented on an electronic display to be adjusted based on depth of objects in the image, thus allowing the viewer's eye to adjust its focal length in a more natural way.

SUMMARY

Embodiments relate to an electronic display having a plurality of layered display panels. The electronic display may be used in a HMD, or other electronic device. For example, the electronic display may include three at least partially overlapping display panels positioned at different distances from the eyes of the user. The three display panels can be used to selectively output images at different focal depths. A display panel may be transparent or substantially transparent for visible light to allow images from one or more other display panels (e.g., located behind the display panel) to be visible through the display panel.

Some embodiments may include a HMD, including: a first display panel to display a first image, and a second display panel positioned in front of the first display panel to at least partially overlap with the first display panel. The second display panel may include a display substrate, and a plurality of light emitting diodes (LEDs) positioned on the display substrate. The plurality of LEDs display a second image. The display substrate and the plurality of LEDs are substantially transparent for the first image to be visible through the second display panel.

The LEDs are inorganic light emitting diodes (ILEDs) and may include a small active light emitting area (e.g., less than 2,000 μm$^2$), transparency or substantial transparency to emitted visible light (e.g., from another LED of another display panel), and collimated light output. The display substrate is a transparent or substantially transparent substrate, such as a sapphire or glass substrate. The LEDs include transparent or substantially transparent semiconductor components such as a LED substrate formed from sapphire or glass, an epitaxial layer shaped into a mesa formed on the LED substrate, and an active layer located in the mesa. The conductive components of the display panel are also transparent or substantially transparent, and may be formed from conductive material such as indium tin oxide (ITO) or gold. Some examples of conductive components may include the trace lines of the display substrate, the electrical contacts of the LEDs, and the bonding material that electrically and mechanically connect the LEDs to the display substrate.

In some embodiments, the HMD may further include a third display panel positioned in front of the second display panel and at least partially overlapping with the first display panel and the second display panel. The third display panel may include a second display substrate, and a second plurality of LEDs positioned on the second display substrate. The second plurality of LEDs display a third image. The second display substrate and the second plurality of LEDs are substantially transparent for the first image and the second image to be visible through the third display panel.

Some embodiments may include an electronic display including a plurality of display panels. The electronic display may include: a first display panel to emit a first light, and a second display panel positioned in front of the first display panel. The second display panel may include: a display substrate, and a plurality of light emitting diodes (LEDs) positioned on the display substrate. The plurality of LEDs emit a second light. The display substrate and the plurality of LEDs are substantially transparent for the first light to pass the first light through the second display panel. In some embodiments, the electronic display includes a third display panel positioned in front of the second display panel and at least partially overlapping with the first display panel and the second display panel. The third display panel is transparent or substantially transparent for the first image and the second image to be visible through the third display panel.

Some embodiments may display a first image by a first display panel, and display a second image by a plurality of light emitting diodes (LEDs) positioned on a display substrate of a second display panel. The second display panel may be positioned in front of the first display panel to at least partially overlap with the first display panel. The display substrate and the plurality of LEDs of the second display panel may be substantially transparent for the first image to be visible through the second display panel.

In some embodiments, a vergence depth of a user's eyes is associated with focal capabilities of the first and second display panels. Data is selectively provided to the first display panel or the second display panel based on the vergence depth and the focal capabilities of the first and second display panels.

BRIEF DESCRIPTION OF THE DRAWINGS

Figure (FIG. 1 is a perspective view of a head-mounted display (HMD), in accordance with one embodiment.

The figures depict embodiments of the present disclosure for purposes of illustration only.

DETAILED DESCRIPTION

Embodiments relate to substantially transparent display panels for HMDs that are layered to display different images. A display panel utilizing LEDs on a transparent substrate can be substantially transparent for light emitted from the LEDs. An LED as discussed herein can be transparent. The HMD may include layered display panels that at least partially overlap. An image may be selectively presented on a particular display panel based on the depth of an object in the image, or based on vergence depth of a user's eyes when viewing the object. The layered display panels allow the HMD to compensate for vergence and accommodation conflict when presenting stereoscopic images that simulate the illusion of depth.

System Overview

Figure 1:
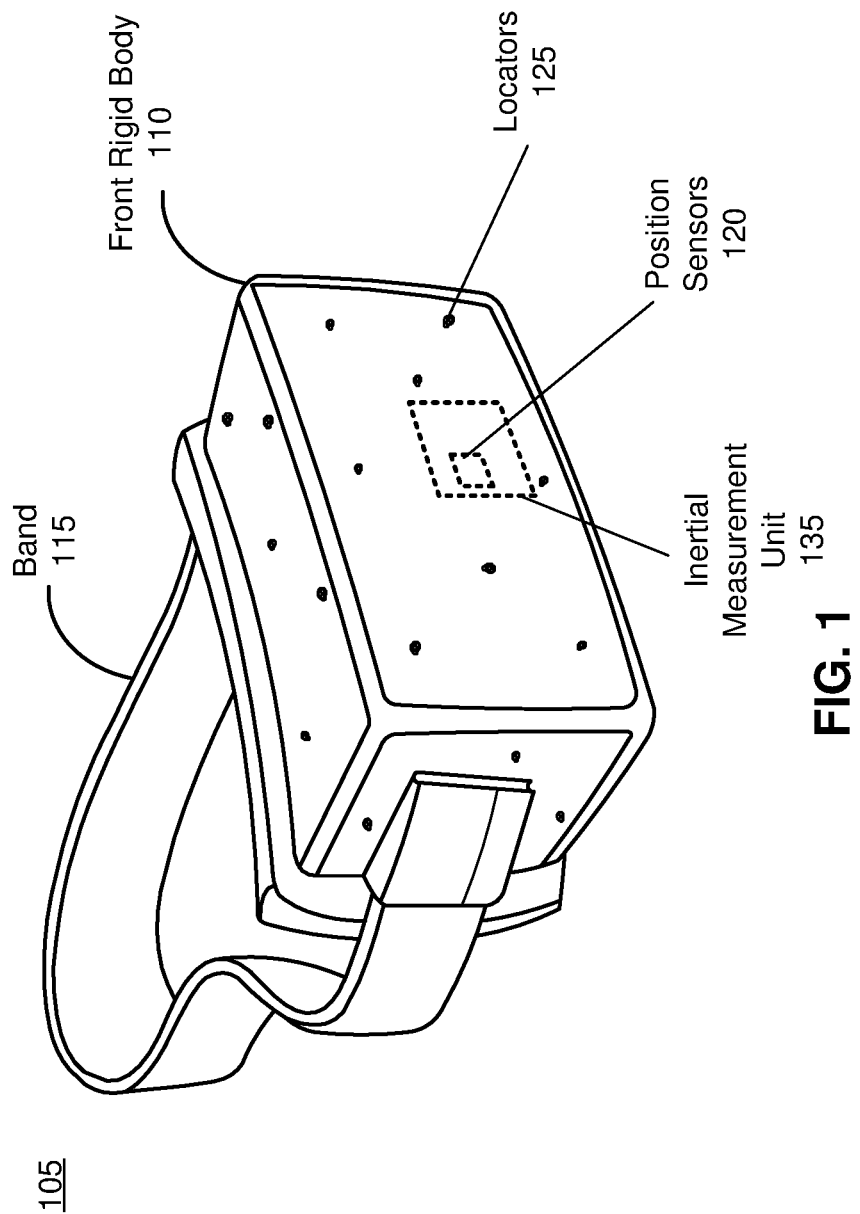

FIG. 1 shows a perspective view of a head-mounted display (HMD) 105, in accordance with one embodiment. The HMD 105 includes a front rigid body 110 and a band 115. The front rigid body 110 includes an electronic display (not shown) including a plurality of display panels, among other components, as discussed in greater detail below and shown in FIG. 2. In some embodiments, the HMD 105 includes sensors that detect user movement (e.g., head movement, eye movement, etc.), and an image is presented to a user through the electronic display according to the user movement detected. For example, the front rigid body 110 may include an inertial measurement unit 135, position sensors 120, and locators 125. These and other components of an HMD are discussed in greater detail below in connection with FIG. 8.

Figure 2:
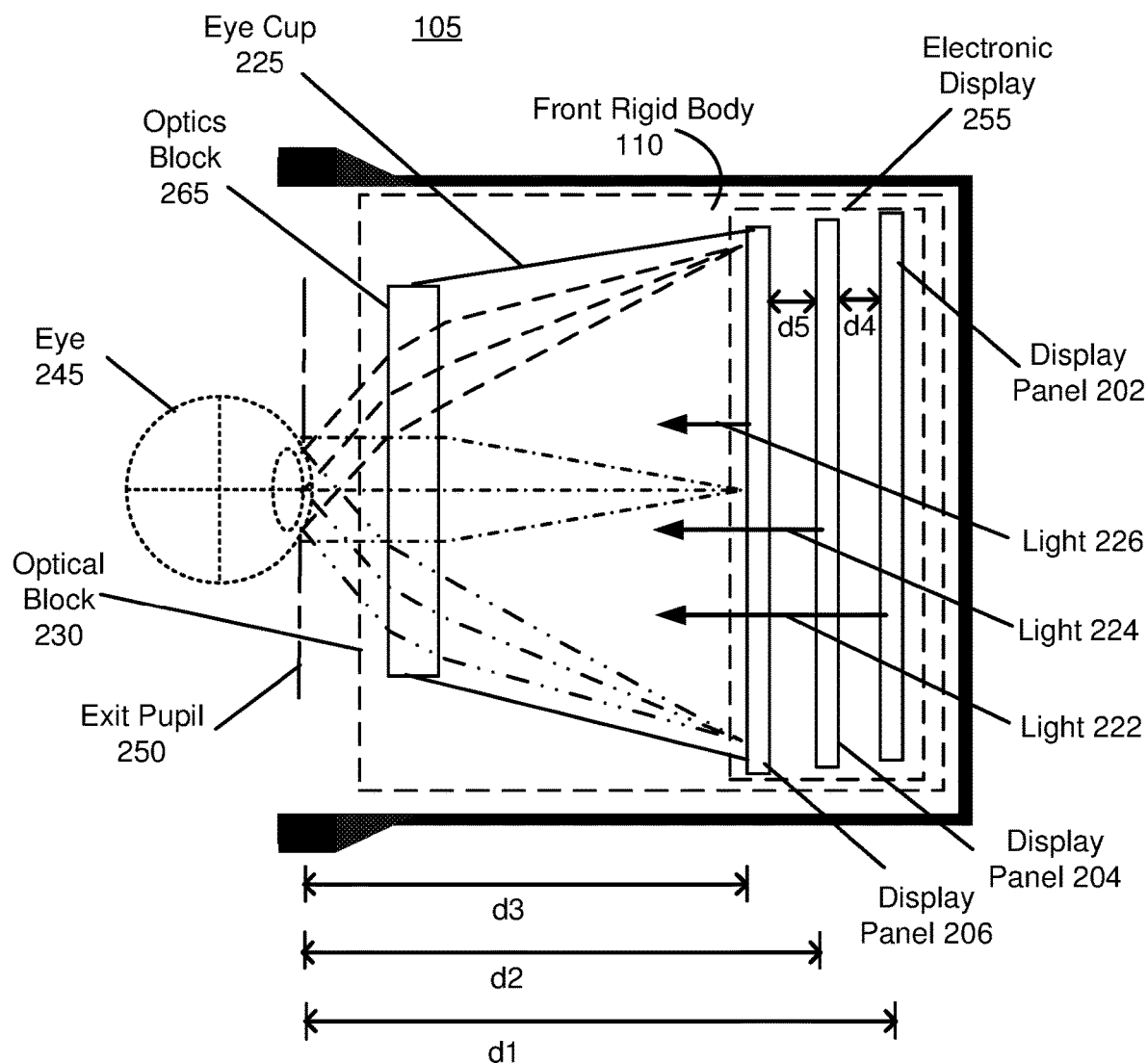
FIG. 2 is a cross sectional diagram illustrating a front rigid body of the HMD in FIG. 1, in accordance with one embodiment.

FIG. 2 is a cross sectional diagram illustrating the front rigid body 110 of the HMD 105 shown in FIG. 1. The front rigid body 110 includes an optical block 230 that provides altered image light to an exit pupil 250. The exit pupil 250 is the location in the front rigid body 110 where a user's eye 245 is positioned. For purposes of illustration, FIG. 2 shows a cross section associated with a single eye 245, but the HMD 105 may include another optical block for another eye of the user.

The optical block 230 may include, among other components, an electronic display 255, an optics block 265, and an eye cup 225. The eye cup 225 is mechanically secured with the front rigid body 110, and holds the optics block 265.

The electronic display 255 includes a plurality of display panels that emit light toward the optics block 265. In some embodiments, the optics block 265 is omitted and the display panels emit light toward the exit pupil 250. The electronic display 255 may include two or more layered display panels. In the example embodiments of FIG. 2, the electronic display 255 includes a first display panel 202, a second display panel 204 positioned in front of the first display panel 202 (i.e., from the perspective of the eye 245), and a third display panel 206 positioned in front of second display panel 204. Each display panel emits light, such as the light 222, 224, and 226 for the display panels 202, 204, and 206 respectively, to provide images to the viewer.

The display panel 202 is positioned a distance d1 from the exit pupil 250, the display panel 204 is positioned a distance d2 from the exit pupil 250, and the display panel 206 is positioned a distance d3 from the exit pupil 250. Here, the distance d1 is larger than the distance d2, and the distance d2 is larger than the distance d3. The display panel 202 is separated by a distance d4 from the display panel 204, and the display panel 204 is separated by a distance d5 from the display panel 206. The distance between adjacent display panels (e.g., d4 or d5) allows the electronic display 255 to produce images at different focal distances to the exit pupil 250. In some embodiments, the distances of the display panels to the exit pupil 250 may be adjustable. In some embodiments, the distance d1 is 0.5 D (diopters), d2 is 1.1 D, d3 is 1.7 D, and d4 and d4 are both between 0.5 D and 0.7 D, such as 0.6 D. In some embodiments, these distances can be changed, such as by the user or programmatically in response to the state of the user's eye.

The display panel 202 is positioned to emit light 222 toward the display panel 204 and the display panel 206. The display panels 204 and 206 are "light transmitting display panels," because the display panels 204 and 206 are transparent or substantially transparent for the light 222 emitted from the display panel 202 to be visible through the display panels 204 and 206. Similarly, the display panel 204 is positioned to emit light 224 toward the display panel 206, and the display panel 206 is transparent or substantially transparent for the light 224. In some embodiments, the furthest display panel 202 is substantially opaque. In other embodiments, the display panel 202 is also a light transmitting display panel such that each display panel of the electronic display 255 has the same structure.

The optics block 265 is a combination of optical components for directing the light from the electronic display 255 to the exit pupil 250 for presentation to the user. The optics block 265 can magnify the light, and in some embodiments, also corrects for one or more additional optical errors (e.g., distortion, astigmatism, etc.).

In some embodiments, the optics block 265 includes a multifocal structure of optical components that adjusts an orientation of the light emitted from a display panel 202, 204, or 206 of the electronic display 255 such that each display panel of the electronic display 255 can appears at one or more particular focal distances from the user. For example, two display panels of the electronic display 255 may each provide for a first and second focal distance, and each of the first and second focal distances may be further modified by the optics block 265 to produce additional configurable focal distances. As such, the plurality of display panels of the electronic display 255 provide for more focal distances than is possible with a single electronic display 255 (e.g., regardless of whether an optics block 265 is used or not).

The multifocal structure of the optics block 265 may include optical components such as a linear polarizer, a liquid crystal (LC) lens element, a partially reflective surface, a passive waveplate (e.g., half waveplate, quarter waveplate), a switchable waveplate (e.g., SHWP), a beam splitter (e.g., 50:50 beam splitter), a beam splitting polarizer (e.g., reflective linear polarizer or wire grid polarizer), a polarization rotator (e.g., a Faraday rotator), or any other suitable optical component that affects the image light emitted from a display panel of the electronic display 255.

In some embodiments, the optics block 265 and the eye cup 225 may be omitted from the optical block 230. The plurality of display panels of the electronic display 255 may be configured to each emit light directly to the eye 245, with the spatial distance between each display panel (e.g., d4, d5, etc.) providing for multiple focal distances.

Figure 3:
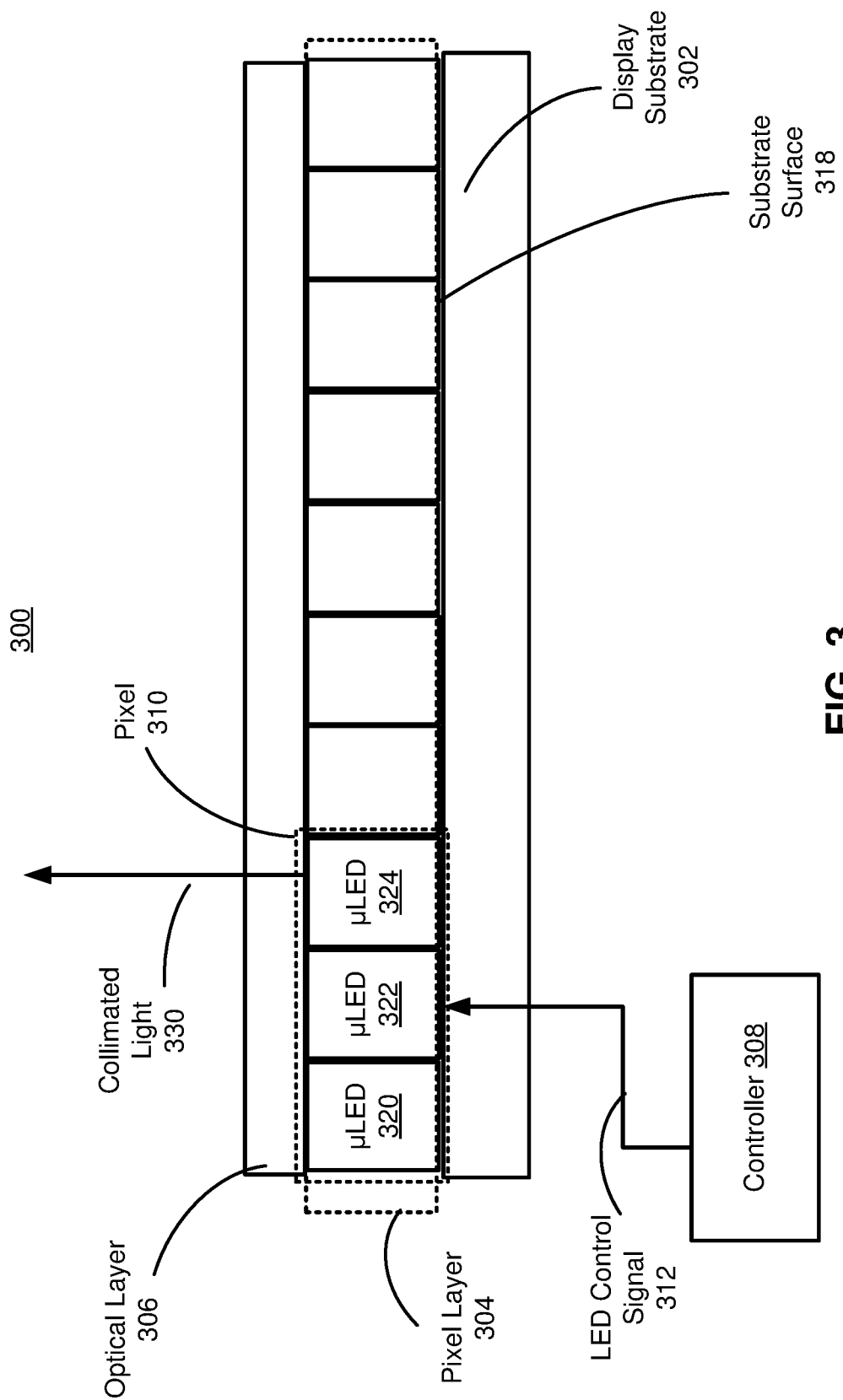
FIG. 3 is a cross sectional diagram of a display panel of an electronic display in the HMD, in accordance with one embodiment.

FIG. 3 is a cross sectional diagram of a display panel 300 of an electronic display 255 in the HMD 105, in accordance with one embodiment. The display panel 300 is an example of a light transmitting display panel, such as the display panel 204 that transmits the light 222 emitted from the display panel 202, or the display panel 206 that transmits the light 224 emitted from the display panel 204 and the light 222 emitted from the display panel 202. In some embodiments, each display panel of an electronic display 255 may be a light transmitting display panel 300, such as each of the display panels 202, 204, and 206.

The display panel 300 may include, among other components, a display substrate 302 (or "substrate 302"), a pixel layer 304, and an optical layer 306. The pixel layer 304 includes a matrix of pixels 310 that are positioned on the substrate surface 318 of the substrate 302. The pixels 310 of the pixel layer 304 emit light to provide images to the viewer. The display substrate 302 provides structural support for various components (e.g., pixels and data/gate lines). The display substrate 302 may also provide electrical connections between the sub-pixel components of the pixels 310 and a controller 308.

Figure 4:
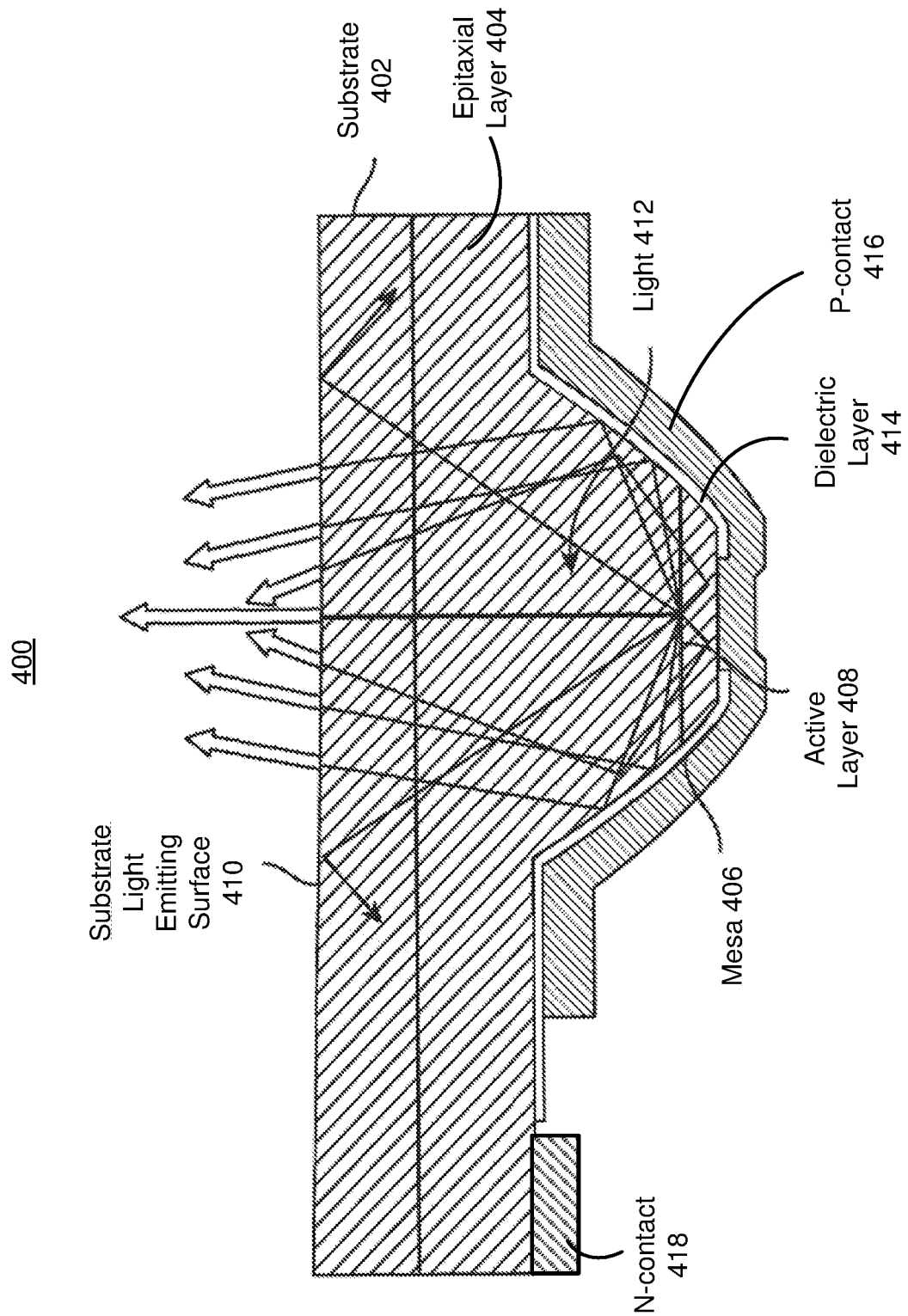
FIG. 4 is a schematic cross section of a μLED of the display panel of FIG. 3, in accordance with one embodiment.

The pixel layer 304 may include, among other components, the sub-pixel components of the pixels 310. For example, a pixel 310 may include one or more light sources, such as μLEDs 320, 322, and 325. As such, the pixel layer 304 includes a matrix of μLEDs aligned in horizontal and vertical directions. An example of a μLED is shown in FIG. 4 and discussed in greater detail below.

The sub-pixel components are positioned on the display substrate 302 adjacent to each other to form a matrix of pixels 310. The light sources may emit color light propagating away from the surface 318 of the substrate 302. In some embodiments, each pixel 310 includes multiple LEDs, such as one or more red LEDs, one or more green LEDs, and one or more blue LEDs. In some embodiments, a pixel 310 can include multiple LEDs of a particular color to provide a uniform light intensity for each color of light emitted from the pixel 310.

In some embodiments where the lighting sources of the display panel 300 include μLEDs, the μLEDs emit a quasi-collimated light 330. The optics block 265 (as shown in FIG. 2) is positioned to receive the quasi-collimated light 330 emitted from the μLEDs.

The lighting sources of the pixel layer 304 may be fabricated separately and then bonded to the surface 318 of the display substrate 302. For example, the μLEDs may be fabricated on a native substrate, singulated, and then transferred to the display substrate 302 to form the pixel layer 304. The μLEDs may be positioned on the substrate surface 318, and then bonded to form electrical connections with the display substrate 302 (e.g., a TFT layer).

In some embodiments, different types of lighting sources may be positioned and bonded to the display substrate 302 in separate bonding cycles. In each bonding cycle, a subset of sub-pixel components for multiple pixels may be picked up from a native substrate or intermediate carrier substrate, placed (e.g., in parallel) onto the display substrate 302, and then electrically bonded with the display substrate via electrical contacts. For example, an (e.g., 2 dimensional) array of red LEDs (for multiple pixels) are first positioned and bonded on the display substrate 302, and then an array of blue LEDs are positioned and bonded on the display substrate 302, and then an array of green LEDs are positioned and bonded on the display substrate 302.

The controller 308 is a circuitry that controls the light emission from the μLEDs 320 through 324 (or other type of lighting sources) via a LED control signal 312.

The optical layer 306 may be disposed on top of the pixel layer 304. The optical layer 306 may include one or more optical elements that transmit the quasi-collimated light 330 having the linear polarization. The optical layer 306 may include brightness enhancement films (BEFs), diffusers, polarizers, etc. The optical layer 306 can change characteristics of the light passed through the optical layer 306, such as to improve the efficiency of light extraction from the display panel. The optical layer 306 may also provide structural protection for the components of the pixel layer 304. In some embodiments, the optical layer 306 is omitted, or is transparent for light transmitted from the pixel layer 304.

The components of the display panel 300 are transparent or substantially transparent for visible light emitted from the μLEDs 320-324. For example, the display substrate 302 may include glass or sapphire, or a combination of transparent optical layers. The display substrate 302 may include transparent or substantially transparent data and gate lines (also referred to as "metal trace lines" herein) formed from indium tin oxide (ITO) or gold. The μLEDs 320 through 324 are electrically connected with the data and gate lines of the display substrate 302 with a transparent or substantially transparent bonding material such as ITO. The μLEDs 320 through 324 are also transparent or substantially transparent for visible light, as discussed in greater detail below in connection with FIG. 4. As such, the display panel 300 is transparent or substantially transparent for visible light that is transmitted from another display panel. In various embodiments, other types of transparent or substantially transparent materials can be used for the components of the display panel 300.

FIG. 4 shows a schematic cross section of a μLED 400, in accordance with one embodiment. A "μLED" or "micro-LED" described herein refers to a particular type of LED having a small active light emitting area (e.g., less than 2,000 μm$^2$), transparency or substantial transparency to emitted visible light (e.g., from another μLED of another display panel), and collimated light output. The collimated light output increases the brightness level of light emitted from the small active light emitting area. The μLED 400 is an example of a lighting source positioned on the surface 318 of the display substrate 302 to emit the quasi-collimated light 330.

The μLED 400 may include, among other components, a LED substrate 402 (or "substrate 402") with a semiconductor epitaxial layer 404 disposed on the substrate 402, a dielectric layer 414 disposed on the epitaxial layer 404, a p-contact 416 disposed on the dielectric layer 414, and an n-contact 418 disposed on the epitaxial layer 404. The epitaxial layer 404 is shaped into a mesa 406. An active (or light emitting) layer 408 (or "active light emitting area") is included in the structure of the mesa 406.

The components of the μLED 400 are transparent or substantially transparent for visible light. For example, the LED substrate 402 may include sapphire, or a glass substrate. The epitaxial layer 404 may include gallium nitride (GaN) or Gallium arsenide (GaAs). The active layer 408 may include indium gallium nitride (InGaN). The type and structure of semiconductor material used may vary to produce μLEDs that emit colors, and may be selected such that the semiconductor material is transparent for the emitted colors of a display panel. The p-contact 416 and n-contact 418 may be contact layers formed from ITO, or some other conductive material that can be transparent at the desired thickness. The transparent or substantially transparent components of the μLED 400 result in the μLED 400 also being transparent or substantially transparent. In various embodiments, other types of transparent or substantially transparent materials can be used for the components of the μLED 400.

The mesa 406 of the epitaxial layer 404 has a truncated top, on a side opposed to a substrate light emitting surface 410 of the substrate 402. The mesa 406 also has a near-parabolic shape to form a reflective enclosure for light generated within the μLED 400. The arrows show how light 412 emitted from the active layer 408 is reflected off the internal walls of the mesa 406 toward the light emitting surface 410 at an angle sufficient for the light to escape the μLED device 400 (i.e., within an angle of total internal reflection). The p-contact 416 and the n-contact 418 electrically connect the μLED 400 to the display substrate 302.

The parabolic shaped structure of the μLED 400 results in an increase in the extraction efficiency of the μLED 400 into low illumination angles when compared to unshaped or standard LEDs. Standard LED dies generally provide an emission full width half maximum (FWHM) angle of 120°. This is dictated by the Lambertian reflectance from a diffuse surface. In comparison the μLED 400 can be designed to provide controlled emission angle FWHM of less than standard LED dies, such as around 60°. This increased efficiency and collimated output of the μLED 400 can produce light visible to the human eye with only nano-amps of drive current.

The μLED 400 may include an active light emitting area that is less than standard inorganic light emitting diodes (ILEDs), such as less than 2,000 μm². The μLED 400 directionalizes the light output from the active light emitting area and increases the brightness level of the light output. The μLED 400 may be less than 50 μm in diameter with a parabolic structure (or a similar structure) etched directly onto the LED die during the wafer processing steps to form the quasi-collimated light 412 emerging from the substrate light emitting surface 410.

As used herein, "directionalized light" refers to collimated and quasi-collimated light. For example, directionalized light may be light that is emitted from a light generating region of a LED and at least a portion of the emitted light is directed into a beam having a half angle. This may increase the brightness of the LED in the direction of the beam of light.

A μLED 400 may include a circular cross section when cut along a horizontal plane as shown in FIG. 4. A μLED 400 may have a parabolic structure etched directly onto the LED die during the wafer processing steps. The parabolic structure may include a light emitting region of the μLED 400 to generate light, and the parabolic structure reflects a portion of the generated light to form the quasi-collimated light 412 emitted from the substrate light emitting surface 410.

Figure 5:
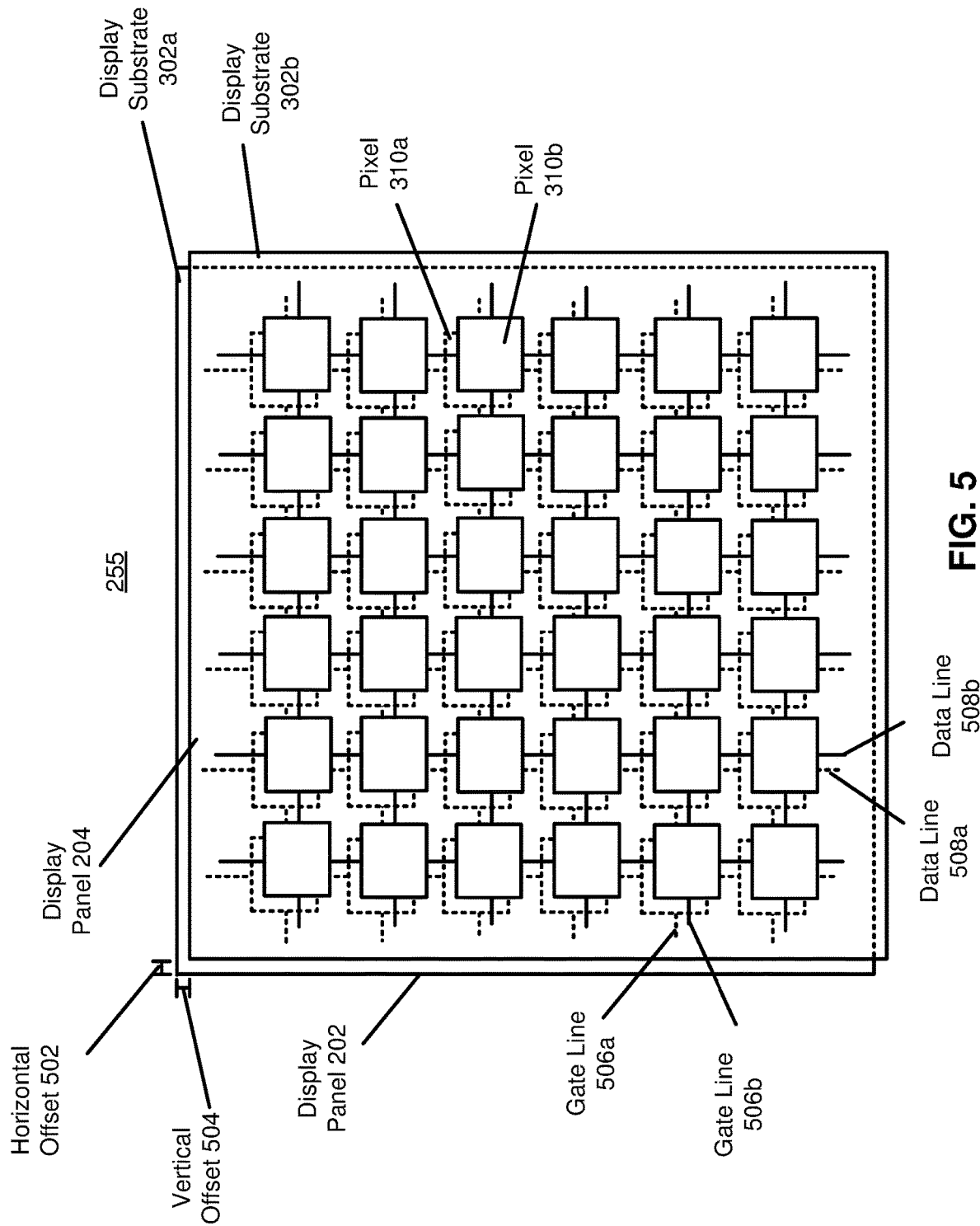
FIG. 5 is a schematic diagram illustrating a spatially offset configuration of display panels of an electronic display, in accordance with one embodiment.

FIG. 5 is a schematic diagram illustrating a spatially offset configuration of display panels 202 and 204 of an electronic display 255, in accordance with one embodiment. Adjacent display panels of the electronic display 255 may be positioned with a slight offset with respect to each other to improve the uniformity of light transparency and output intensity across the electronic display 255. For example, the display panel 202, shown in outline as being behind the display panel 204, is positioned with a horizontal offset 502 and a vertical offset 504 relative to the display panel 204. Adjacent display panels may include a vertical offset, a horizontal offset, or both vertical and horizontal offsets.

The spatial offset of display panels 202 and 204 results in a spatial offset of corresponding pixels, gate lines, and data lines. For example, the pixel 310a of the display panel 202 is offset from the pixel 310b of the display panel 204, the gate lines 506a of the display panel 202 are offset from the gate lines 506b of the display panel 204, and the data lines 508a of the display panel 202 are offset from the data lines 508b of the display panel 204.

A display panel may include non-uniform transparency across the display surface. For example, a display panel may have lower transparency in regions including a substrate with gate lines, data lines, pixels, or other components, and higher transparency in regions including only the substrate. As such, the spatial offset of the display panel 202 and the display panel 204 results in a spatial offset of the lower transparency regions. If multiple (e.g., 3 or more) display panels are stacked without any offset, the lower transparency regions from the display panels would spatially overlap to result in regions of low transparency and weak output light intensity. For example, portions of light emitted from the display panel 202 would pass through multiple lower transparency regions of the display panel 204 and display panel 206, while other portions of light emitted from the display panel 204 would pass through only higher transparency substrate regions of the display panel 204 and display panel 206. Thus the uniformity of transparency and light output can be improved by spatially offsetting adjacent display panels.

Although not shown in FIG. 5, one or more additional display panels may be layered on top of the display panels 202 and 204, such as the display panel 206 shown in FIG. 2. The display panel 206 may be spatially offset from both the display panel 204 and the display panel 202 such that no corresponding lower transparency components of the display panels 202, 204, or 206 spatially overlap. Among other things, providing spatial offset for display panels avoids the need for active alignment, and allow for passive digital alignment.

Figure 6:
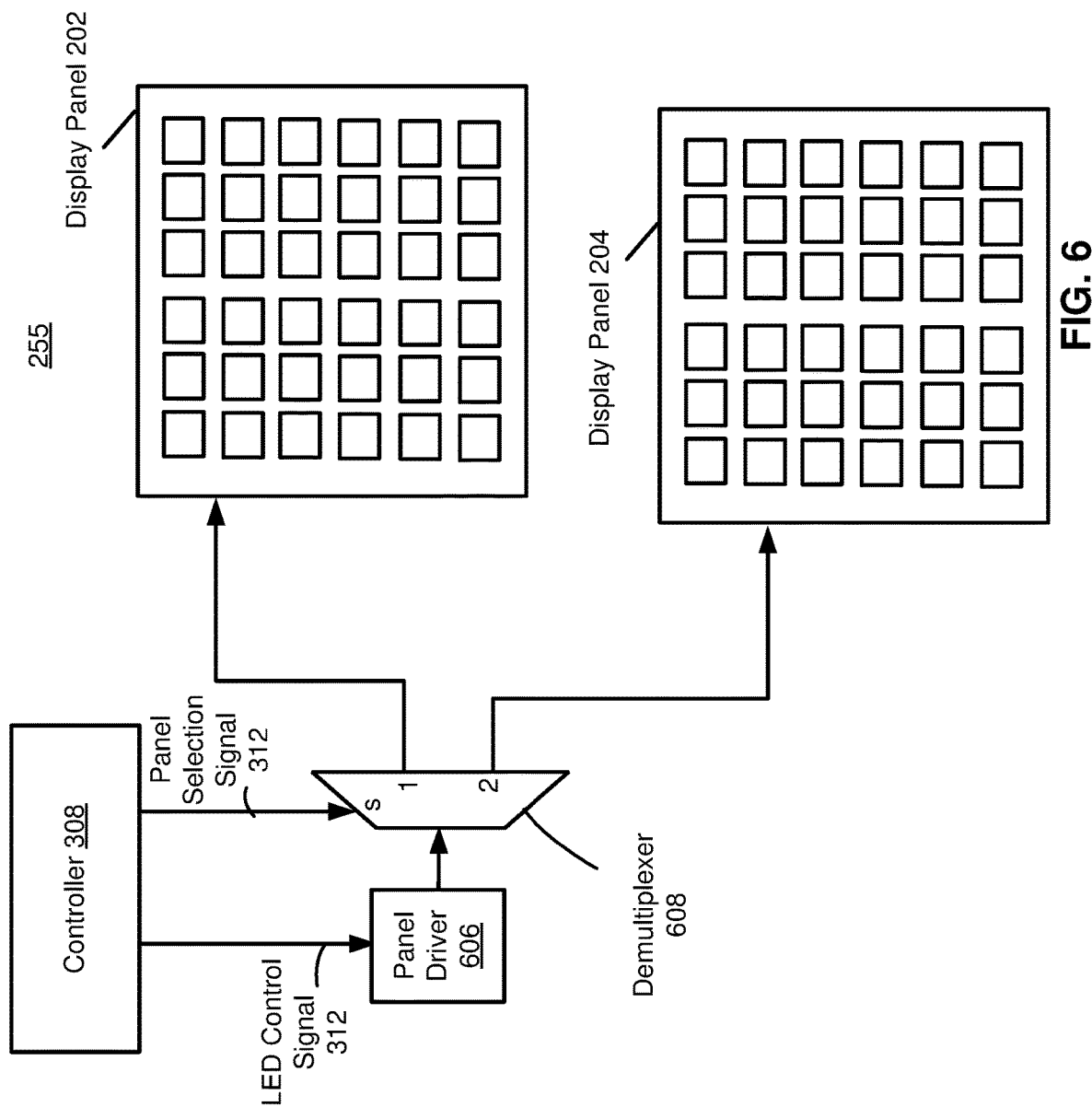
FIG. 6 is a schematic diagram illustrating a control system for multiple display panels of an electronic display, in accordance with one embodiment.

FIG. 6 is a diagram illustrating a control system for multiple display panels of an electronic display 255, in accordance with one embodiment. A plurality of display panels of an electronic display can share a panel driver 606. The controller 308 provides the LED control signal 312 to the panel driver 606 that causes the panel driver 606 to generate an output for the gate and data lines of a display panel. The output of the panel driver 606 is input to the demultiplexer 608. The controller 308 also provides a panel selection signal 314 to the selector (s) of the demultiplexer 608. The panel selection signal 314 causes the demultiplexer 608 to route the output of the panel driver 606 to the gate and data lines of the display panel 202 (1) or the gate and data lines of the display panel 204 (2). The selection of a display panel from multiple layered display panels may be determined based on the desired focal distance. As discussed in greater detail below in connection with FIG. 9, the desired focal distance may be selected based on tracking eye positions of the viewer, calculating a vergence depth of the eyes, and selecting one of the display panels of the electronic display to output a virtual scene at a focal distance that corresponds with the determined vergence depth.

Although the electronic display 255 may include two or more display panels, only two display panels 202 and 204 are shown for the electronic display 255 in FIG. 6 to avoid overcomplicating the disclosure. The shared panel driver control scheme can be extended to additional display panels. For an electronic display having N display panels, a panel driver 606 can selectively output to one of the N display panels using a demultiplexer having N outputs of gate and data line signals. For an example where the electronic display includes three display panels 202, 204, and 206, the demultiplexer 608 may have three outputs each connected with one of the three display panels 202, 204, and 206. The panel selection signal 314 from the controller 308 causes the demultiplexer 608 to route the output of the panel driver 606 to one of the display panels 202, 204, or 206.

In some embodiments, the panel driver 606 includes a gate driver for the gate lines of multiple display panels and a separate data driver for the data lines of the display panels. The outputs of the gate driver and data driver are input to the demultiplexer 608, which selectively routes the outputs to a particular display panel.

Figure 7:
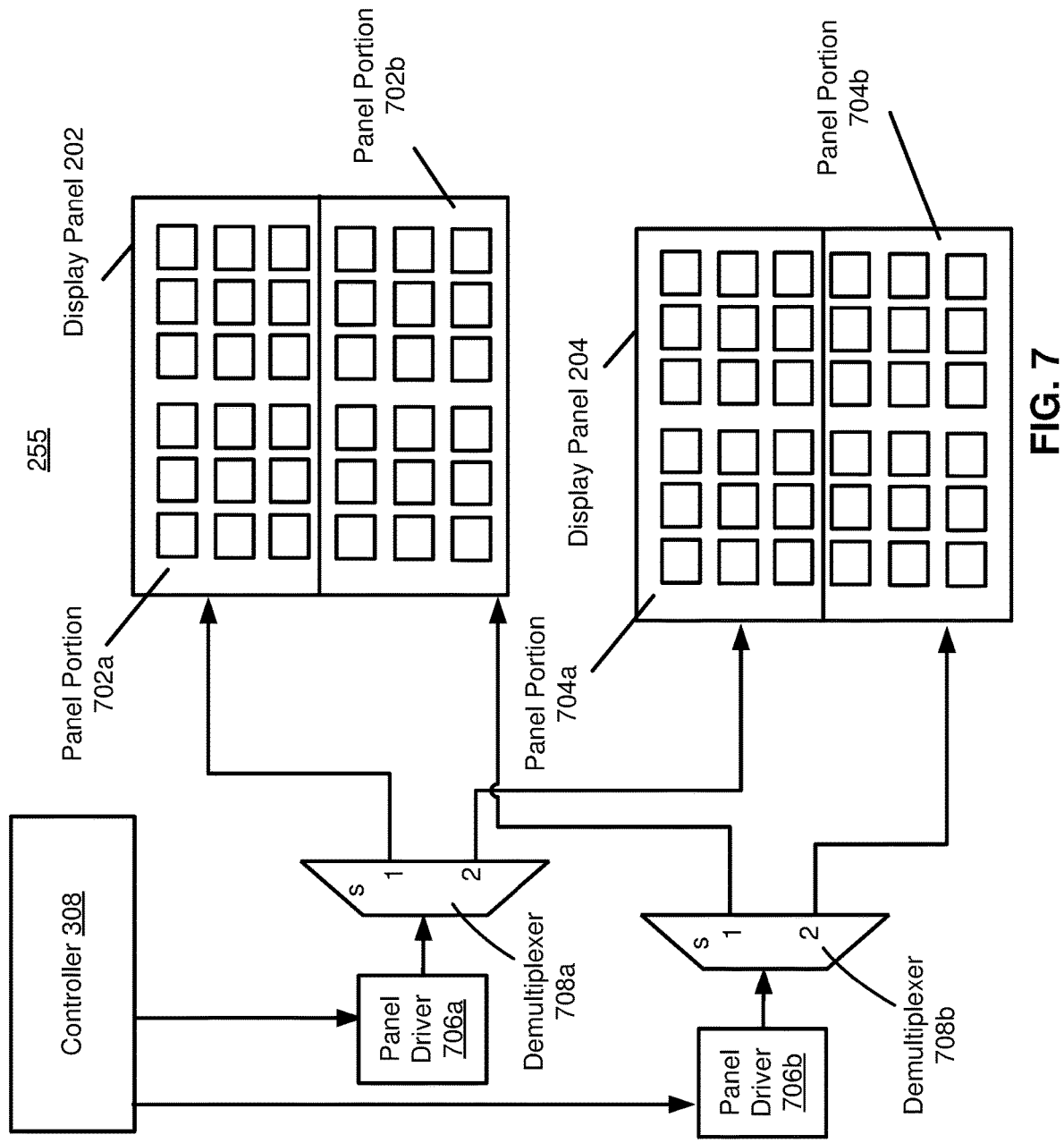
FIG. 7 is a schematic diagram illustrating a control system for multiple display panels each having separate panel portions, in accordance with one embodiment.

FIG. 7 is a diagram illustrating a control system for multiple display panels each having separate panel portions, in accordance with one embodiment. The display panels 202 and 204 of the electronic display 255 may each be formed from separate panel portions, where each panel portion of a display panel has a separate display substrate with gate and data lines. For example, the display panel 202 includes a panel portion 702a and a panel portion 702b. The display panel 204 includes a panel portion 704a and a panel portion 704b. The panel portions of a display panel are aligned to provide an image plane for the display panel.

The panel portions 702a and 704a are corresponding panel portions representing a top portion of display panels 202 and 204 respectively, and the panel portions 702b and 704b are corresponding panel portions representing a bottom portion of the display panels 202 and 204 respectively. A panel driver 706a is connected to the corresponding panel portions 702a and 704a by a demultiplexer 708a. A panel driver 707b is connected to the corresponding panel portions 702b and 704b by the demultiplexer 708b. By controlling the demultiplexer 708a, data for the top half of an image frame can be presented on either the display panel portion 702a of the display panel 202, or the corresponding display panel portion 704a of the display panel 202. By controlling the demultiplexer 708b, data for the bottom half of the image frame can be presented on either the display panel portion 702b of the display panel 204, or the corresponding display panel portion 704b of the display panel 204. As such, different panel portions of each display panel can be activated or deactivated. Furthermore, portions of an image frame presented by the electronic display 255 can be output from different panel portions of different display panels.

Only two display panels 202 and 204, each having top and bottom panel portions, are shown for the electronic display 255 in FIG. 7 to avoid overcomplicating the disclosure. A similar control scheme can be extended to additional display panels and/or additional panel portions per display panel. For an electronic display with N layered display panels each having M panel portions, the electronic display may include M panel drivers connected with M multiplexers. Each of the M multiplexers may include N outputs of gate and data lines. Each of the N outputs of gate and data lines of a multiplexer may be connected to a corresponding panel portion of the N display panels.

System Overview

Figure 8:
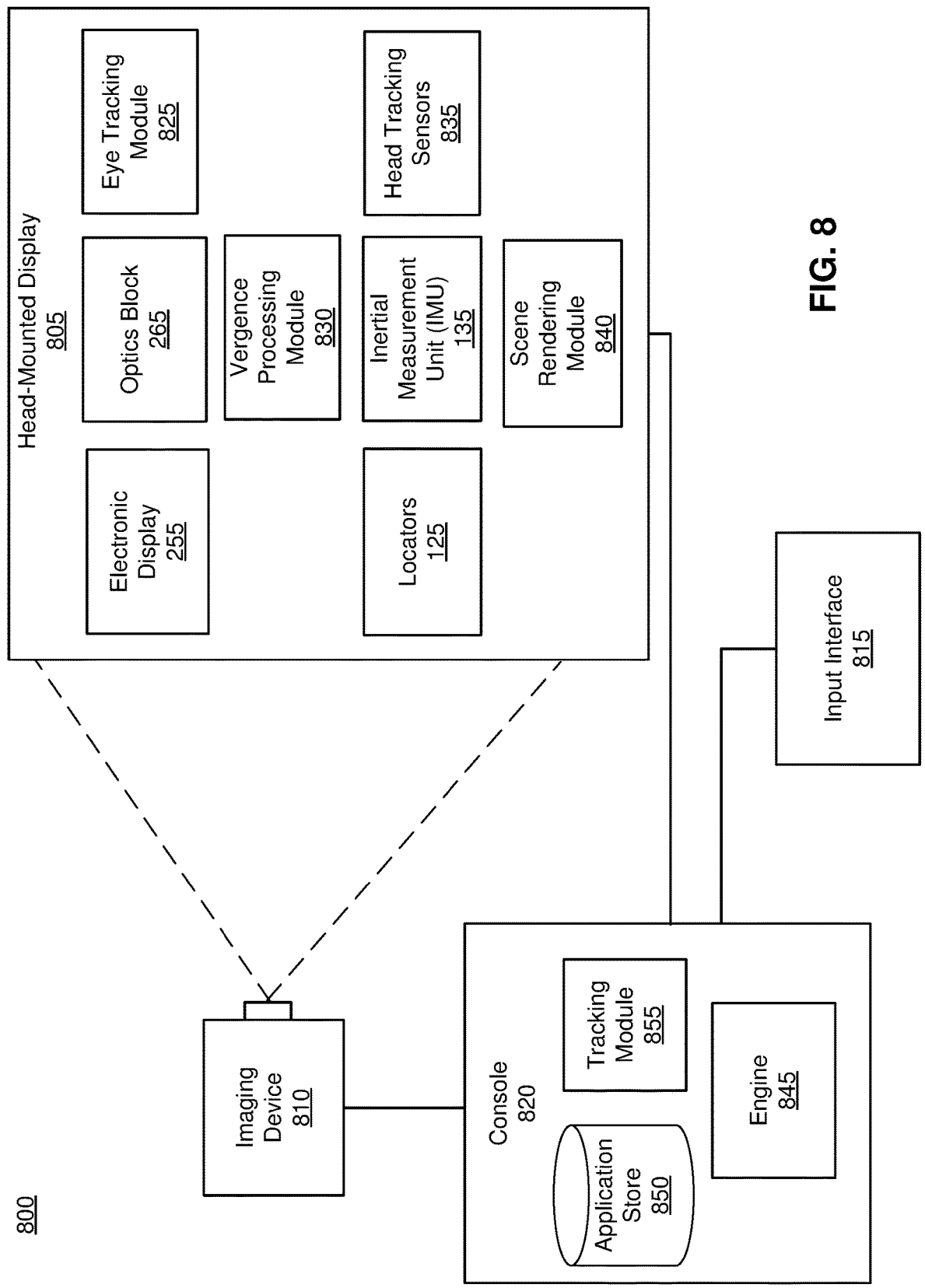
FIG. 8 is a schematic diagram illustrating a system in which a HMD operates, in accordance with one embodiment.

FIG. 8 is a schematic diagram illustrating a system 800 in which a HMD 805 operates. The system 800 may be for use as a virtual reality (VR) system, an augmented reality (AR) system, a mixed reality (MR) system, or some combination thereof. In this example, the system 800 includes a HMD 805, an imaging device 810, and an input interface 815, which are each coupled to a console 820. While FIG. 8 shows a single HMD 805, a single imaging device 810, and a single input interface 815, in other embodiments, any number of these components may be included in the system. For example, there may be multiple HMDs 805 each having an associated input interface 815 and being monitored by one or more imaging devices 810, with each HMD 805, input interface 815, and imaging devices 810 communicating with the console 820. In alternative configurations, different and/or additional components may also be included in the system 800. The HMD 805 may act as a VR, AR, and/or a MR HMD. An MR and/or AR HMD augments views of a physical, real-world environment with computer-generated elements (e.g., images, video, sound, etc.).

The HMD 805 presents content to a user. In some embodiments, the HMD 805 is an embodiment of the HMD 105 described above with reference to FIGS. 1 and 2. Example content includes images, video, audio, or some combination thereof. Audio content may be presented via a separate device (e.g., speakers and/or headphones) external to the HMD 805 that receives audio information from the HMD 805, the console 820, or both. The HMD 805 includes an electronic display 255, the optics block 265, an eye tracking module 825, a vergence processing module 830, one or more locators 125, an internal measurement unit (IMU) 135, head tracking sensors 835, and a scene rendering module 840.

The eye tracking module 825 tracks an eye position and eye movement of a user of the HMD 805. A camera or other optical sensor inside the HMD 805 captures image information of a user's eyes, and eye tracking module 825 uses the captured information to determine interpupillary distance, interocular distance, a three-dimensional (3D) position of each eye relative to the HMD 805 (e.g., for distortion adjustment purposes), including a magnitude of torsion and rotation (i.e., roll, pitch, and yaw) and gaze directions for each eye. In one example, infrared light is emitted within the HMD 1054 and reflected from each eye. The reflected light is received or detected by the camera and analyzed to extract eye rotation from changes in the infrared light reflected by each eye. Many methods for tracking the eyes of a user can be used by eye tracking module 825. Accordingly, the eye tracking module 825 may track up to six degrees of freedom of each eye (i.e., 3D position, roll, pitch, and yaw) and at least a subset of the tracked quantities may be combined from two eyes of a user to estimate a gaze point (i.e., a 3D location or position in the virtual scene where the user is looking). For example, the eye tracking module 825 integrates information from past measurements, measurements identifying a position of a user's head, and 3D information describing a scene presented by the electronic display 255. Thus, information for the position and orientation of the user's eyes is used to determine the gaze point in a virtual scene presented by the HMD 805 where the user is looking.

The vergence processing module 830 determines a vergence depth of a user's gaze based on the gaze point or an estimated intersection of the gaze lines determined by the eye tracking module 825. Vergence is the simultaneous movement or rotation of both eyes in opposite directions to maintain single binocular vision, which is naturally and automatically performed by the human eye. Thus, a location where a user's eyes are verged is where the user is looking and is also typically the location where the user's eyes are focused. For example, the vergence processing module 830 triangulates the gaze lines to estimate a distance or depth from the user associated with intersection of the gaze lines. The depth associated with intersection of the gaze lines can then be used as an approximation for the accommodation distance, which identifies a distance from the user where the user's eyes are directed. Thus, the vergence distance allows determination of a location where the user's eyes should be focused.

The locators 125 are objects located in specific positions on the HMD 805 relative to one another and relative to a specific reference point on the HMD 805. A locator 125 may be a light emitting diode (LED), a corner cube reflector, a reflective marker, a type of light source that contrasts with an environment in which the HMD 805 operates, or some combination thereof. Active locators 125 (i.e., an LED or other type of light emitting device) may emit light in the visible band (~380 nm to 850 nm), in the infrared (IR) band (~850 nm to 1 mm), in the ultraviolet band (10 nm to 380 nm), some other portion of the electromagnetic spectrum, or some combination thereof.

The locators 125 can be located beneath an outer surface of the HMD 805, which is transparent to the wavelengths of light emitted or reflected by the locators 125 or is thin enough not to substantially attenuate the wavelengths of light emitted or reflected by the locators 125. Further, the outer surface or other portions of the HMD 805 can be opaque in the visible band of wavelengths of light. Thus, the locators 125 may emit light in the IR band while under an outer surface of the HMD 805 that is transparent in the IR band but opaque in the visible band.

The IMU 135 is an electronic device that generates fast calibration data based on measurement signals received from one or more of the head tracking sensors 835, which generate one or more measurement signals in response to motion of HMD 805. Examples of the head tracking sensors 835 include accelerometers, gyroscopes, magnetometers, other sensors suitable for detecting motion, correcting error associated with the IMU 135, or some combination thereof. The head tracking sensors 835 may be located external to the IMU 135, internal to the IMU 135, or some combination thereof.

Based on the measurement signals from the head tracking sensors 835, the IMU 135 generates fast calibration data indicating an estimated position of the HMD 805 relative to an initial position of the HMD 805. For example, the head tracking sensors 835 include multiple accelerometers to measure translational motion (forward/back, up/down, left/right) and multiple gyroscopes to measure rotational motion (e.g., pitch, yaw, and roll). The IMU 135 can, for example, rapidly sample the measurement signals and calculate the estimated position of the HMD 805 from the sampled data. For example, the IMU 135 integrates measurement signals received from the accelerometers over time to estimate a velocity vector and integrates the velocity vector over time to determine an estimated position of a reference point on the HMD 805. The reference point is a point that may be used to describe the position of the HMD 805. While the reference point may generally be defined as a point in space, in various embodiments, a reference point is defined as a point within the HMD 805 (e.g., a center of the IMU 135).

Alternatively, the IMU 135 provides the sampled measurement signals to the console 820, which determines the fast calibration data.

The IMU 135 can additionally receive one or more calibration parameters from the console 820. As further discussed below, the one or more calibration parameters are used to maintain tracking of the HMD 805. Based on a received calibration parameter, the IMU 135 may adjust one or more of the IMU parameters (e.g., sample rate). In some embodiments, certain calibration parameters cause the IMU 135 to update an initial position of the reference point to correspond to a next calibrated position of the reference point. Updating the initial position of the reference point as the next calibrated position of the reference point helps reduce accumulated error associated with determining the estimated position. The accumulated error, also referred to as drift error, causes the estimated position of the reference point to "drift" away from the actual position of the reference point over time.

The scene rendering module 840 receives content for the virtual scene from a (e.g., VR) engine 845 and provides the content for display on the electronic display 255. Additionally, the scene rendering module 840 can adjust the content based on information from the vergence processing module 830, the IMU 135, and the head tracking sensors 835. The scene rendering module 840 determines a portion of the content to be displayed on the electronic display 255 based on one or more of the tracking module 855, the head tracking sensors 835, or the IMU 135, as described further below.

The imaging device 810 generates slow calibration data in accordance with calibration parameters received from the console 820. Slow calibration data includes one or more images showing observed positions of the locators 125 that are detectable by imaging device 810. The imaging device 810 may include one or more cameras, one or more video cameras, other devices capable of capturing images including one or more locators 125, or some combination thereof. Additionally, the imaging device 810 may include one or more filters (e.g., for increasing signal to noise ratio). The imaging device 810 is configured to detect light emitted or reflected from the locators 125 in a field of view of the imaging device 810. In embodiments where the locators 125 include passive elements (e.g., a retroreflector), the imaging device 810 may include a light source that illuminates some or all of the locators 125, which retro-reflect the light towards the light source in the imaging device 810. Slow calibration data is communicated from the imaging device 810 to the console 820, and the imaging device 810 receives one or more calibration parameters from the console 820 to adjust one or more imaging parameters (e.g., focal length, focus, frame rate, ISO, sensor temperature, shutter speed, aperture, etc.).

The input interface 815 is a device that allows a user to send action requests to the console 820. An action request is a request to perform a particular action. For example, an action request may be to start or end an application or to perform a particular action within the application. The input interface 815 may include one or more input devices. Example input devices include a keyboard, a mouse, a game controller, or any other suitable device for receiving action requests and communicating the received action requests to the console 820. An action request received by the input interface 815 is communicated to the console 820, which performs an action corresponding to the action request. In some embodiments, the input interface 815 may provide haptic feedback to the user in accordance with instructions received from the console 820. For example, haptic feedback is provided by the input interface 815 when an action request is received, or the console 820 communicates instructions to the input interface 815 causing the input interface 815 to generate haptic feedback when the console 820 performs an action.

The console 820 provides content to the HMD 805 for presentation to the user in accordance with information received from the imaging device 810, the HMD 805, or the input interface 815. In the example shown in FIG. 8, the console 820 includes an application store 850, a tracking module 855, and the engine 845. Some embodiments of the console 820 have different or additional modules than those described in conjunction with FIG. 8. Similarly, the functions further described below may be distributed among components of the console 820 in a different manner than is described here.

The application store 850 stores one or more applications for execution by the console 820. An application is a group of instructions, that when executed by a processor, generates content for presentation to the user. Content generated by an application may be in response to inputs received from the user via movement of the HMD 805 or the input interface 815. Examples of applications include gaming applications, conferencing applications, video playback application, or other suitable applications.

The tracking module 855 calibrates the optics block 265 using one or more calibration parameters and may adjust one or more calibration parameters to reduce error in determining position of the HMD 805. For example, the tracking module 855 adjusts the focus of the imaging device 810 to obtain a more accurate position for observed locators 125 on the HMD 805. Moreover, calibration performed by the tracking module 855 also accounts for information received from the IMU 135. Additionally, if tracking of the HMD 805 is lost (e.g., imaging device 810 loses line of sight of at least a threshold number of locators 125), the tracking module 855 re-calibrates some or all of the system 800 components.

Additionally, the tracking module 855 tracks the movement of the HMD 805 using slow calibration information from the imaging device 810 and determines positions of a reference point on the HMD 805 using observed locators from the slow calibration information and a model of the HMD 805. The tracking module 855 also determines positions of the reference point on the HMD 805 using position information from the fast calibration information from the IMU 135 on the HMD 805. Additionally, the tracking module 855 may use portions of the fast calibration information, the slow calibration information, or some combination thereof, to predict a future location of the HMD 805, which is provided to the engine 845.

The engine 845 executes applications within the system 800 and receives position information, acceleration information, velocity information, predicted future positions, or some combination thereof for the HMD 805 from the tracking module 855. Based on the received information, the engine 845 determines content to provide to the HMD 805 for presentation to the user, such as a virtual scene, one or more virtual objects to overlay onto a real world scene, etc.

In some embodiments, the engine 845 maintains focal capability information of plurality of display panels of the electronic display. Focal capability information is information that describes what focal distances are available to the electronic display. Focal capability information may include a mapping of focal planes to display panels of the electronic display. Focal capability information may additionally include information that describes focal distances available to the optics block 265. Such focal capability information may include, e.g., a range of focus the optics block 265 is able to accommodate (e.g., 0 to 4 diopters), a resolution of focus (e.g., 0.25 diopters), a number of focal planes, combinations of settings for optical components of the optics block 265 and display panel selection that map to particular focal planes, or some combination thereof.

The engine 845 generates focus instructions for the electronic display 255 that controls output to selected display panels or portions of display panels. The engine 845 may also generate focus instructions for the optics block 265, the instructions causing the optics block 265 to adjust its focal distance to a particular location. The engine 845 generates the focus instructions based on focal capability information and, e.g., information from the vergence processing module 830, the IMU 135, and the head tracking sensors 835. The engine 845 uses the information from the vergence processing module 830, the IMU 135, and the head tracking sensors 835, or some combination thereof, to select an ideal focal plane to present content to the user. The engine 845 then uses the focal capability information to select a focal plane that is closest to the ideal focal plane. The engine 845 uses the focal information to determine settings for electronic display 255 and optics block 265 that are associated with the selected focal plane. The engine 845 generates instructions based on the determined settings, and provides the instructions the electronic display 255 (e.g., the LED control signal 312 and/or panel selection signal 314).

Additionally, the engine 845 performs an action within an application executing on the console 820 in response to an action request received from the input interface 815 and provides feedback to the user that the action was performed. The provided feedback may be visual or audible feedback via the HMD 805 or haptic feedback via input interface 815.

Figure 9:
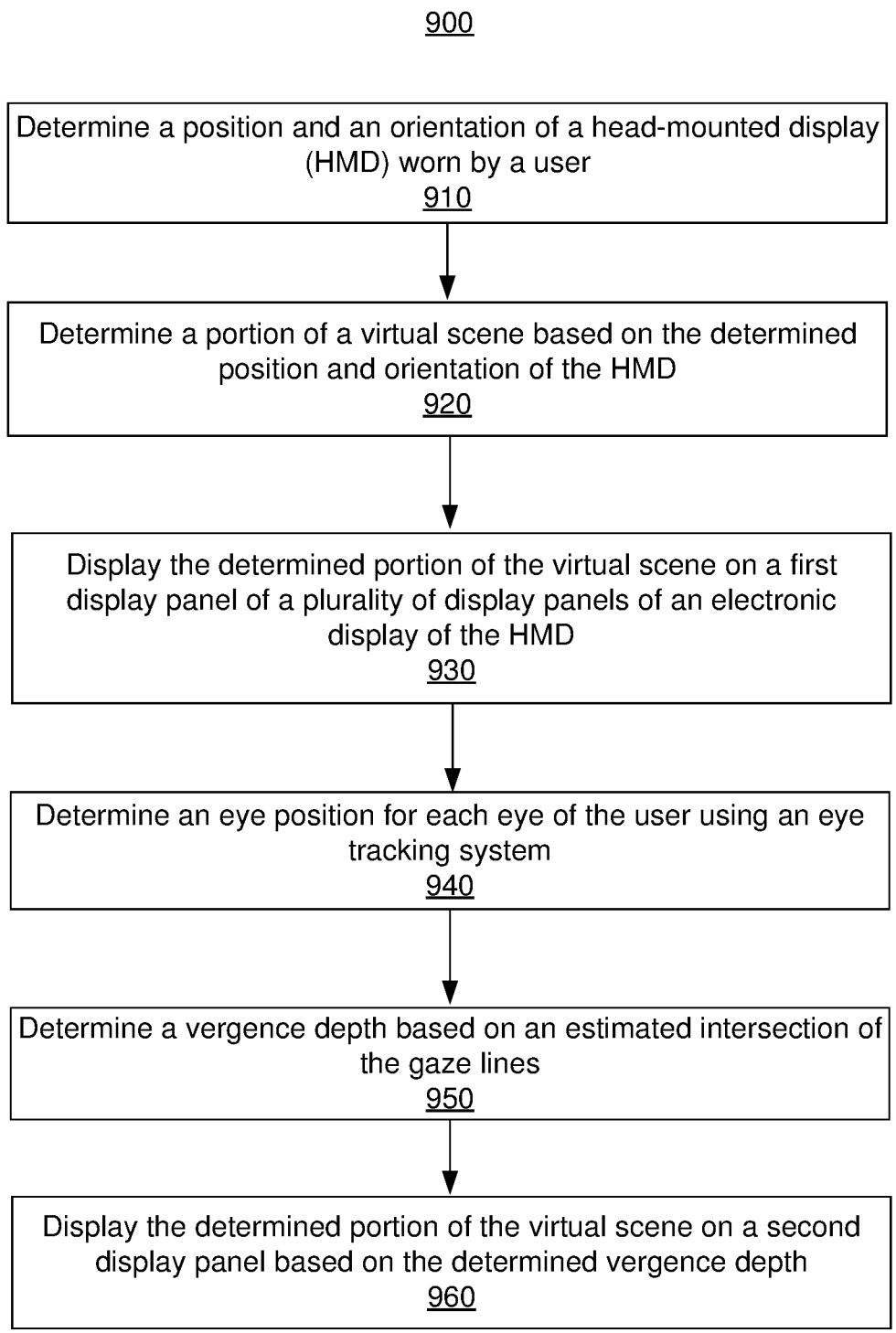
FIG. 9 is a flow chart illustrating a process for mitigating vergence-accommodation conflict with an electronic display having layered display panels, in accordance with one embodiment.

FIG. 9 is a flow chart illustrating a process 900 for mitigating vergence-accommodation conflict with an electronic display 255 having layered display panels, in accordance with one embodiment. The process 900 may be performed by the system 800 in some embodiments. Alternatively, other components may perform some or all of the steps of the process 900. For example, in some embodiments, a HMD 805 and/or a console (e.g., console 820) may perform some of the steps of the process 900. Additionally, the process 900 may include different or additional steps than those described in conjunction with FIG. 9 in some embodiments or perform steps in different orders than the order described in conjunction with FIG. 9.

As discussed above, a system 800 may dynamically vary its focus to presenting images on layered display panels located at different distances from the viewer, which keeps the user's eyes in a zone of comfort as vergence and accommodation change. Additionally, eye tracking in combination with the variable focus of the system 800 allows blurring to be introduced as depth cues in images presented by the HMD 805.

The system 800 determines 910 a position, an orientation, and/or a movement of HMD 805. The position is determined by a combination of the locators 125, the IMU 135, the head tracking sensors 835, the imagining device 810, and the tracking module 855, as described above in conjunction with FIG. 8.

The system 800 determines 920 a portion of a virtual scene based on the determined position and orientation of the HMD 805. The system 800 maps a virtual scene presented by the HMD 805 to various positions and orientations of the HMD 805. Thus, a portion of the virtual scene currently viewed by the user is determined based on the position, orientation, and movement of the HMD 805.

The system 800 displays 930 the determined portion of the virtual scene on a first display panel of a plurality of display panels of an electronic display (e.g., the electronic display 255) of the HMD 805. In some embodiments, the display panel may be selected based on the focal distance of objects displayed in the virtual scene. For example, the display panel 202 may be selected for a far focal distance, the display panel 204 may be selected for an intermediate focal distance, and the display panel 206 may be selected for a near focal distance. In some embodiments, the intermediate display panel 240 is a default display panel for an image, and some or all portions of the image may be moved to another display panel based on the position of the user's eyes, as discussed in greater detail below.

In some embodiments, the portion of the virtual scene is displayed with a distortion correction to correct for optical error that may be caused by the image light passing through the optics block 265. Further, optics block 265 may provide further focus and accommodation to the location in the portion of the virtual scene where the user's eyes are verged.

The system 800 determines 940 an eye position for each eye of the user using an eye tracking system. The system 800 determines a location or an object within the determined portion at which the user is looking to adjust focus for that location or object accordingly. To determine the location or object within the determined portion of the virtual scene at which the user is looking, the HMD 805 tracks the position and location of the user's eyes using image information from an eye tracking system (e.g., eye tracking module 825). For example, the HMD 805 tracks at least a subset of a 3D position, roll, pitch, and yaw of each eye and uses these quantities to estimate a 3D gaze point of each eye.

Figure 10:
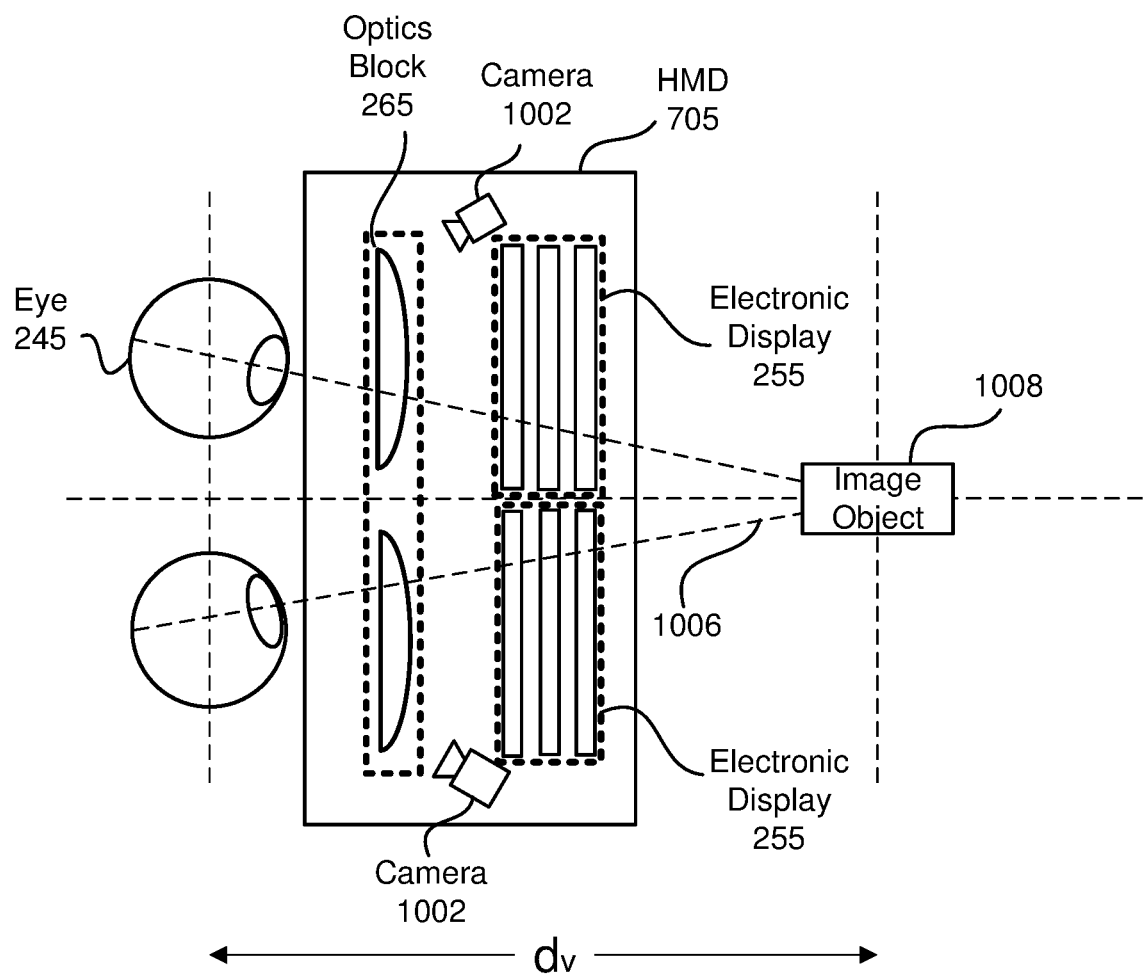
FIG. 10 is a schematic diagram illustrating the process for mitigating vergence-accommodation conflict with an electronic display having layered display panels, in accordance with one embodiment.

The system 800 determines 950 a vergence depth based on an estimated intersection of gaze lines. For example, FIG. 10 shows a cross section of an embodiment of the HMD 805 that includes camera 1002 for tracking a position of each eye 245. In this example, the camera 1002 captures images of the user's eyes looking at an image object 1008 and the eye tracking module 825 determines an output for each eye 245 and gaze lines 1006 corresponding to the gaze point or location where the user is looking based on the captured images. Accordingly, vergence depth (dv) of the image object 1008 (also the user's gaze point) is determined based on an estimated intersection of the gaze lines 1006. As shown in FIG. 10, the gaze lines 1006 converge or intersect at distance dv, where the image object 1008 is located. In some embodiments, information from past eye positions, information describing a position of the user's head, and information describing a scene presented to the user may also be used to estimate the 3D gaze point of an eye in various embodiments.

Accordingly, referring again to FIG. 9, the system 800 displays 960 the determined portion of the virtual scene on a second display panel of the plurality of display panels of the electronic display based on the determined vergence depth. For example, if the portion of the virtual scene was previously displayed on the display panel 204 of the electronic display 255, then the portion of the virtual scene may be moved to either the display panel 202 or the display panel 206 depending on the new determined vergence depth. If the vergence depth indicates a larger focal distance, the display panel 202 furthest from the eyes of viewer may be selected. In another example, if the vergence depth indicates a smaller focal distance, the display panel 206 nearest to the viewer eyes of the viewer may be selected. In another example, if the vergence depth indicates no change in focal distance, the portion of the virtual scene can be continued to be displayed on the first display panel.

The electronic displays discussed herein include multiple display panels with substantially transparent substrates, micro-LEDs, and conductive materials. The micro-LEDs provide this transparency in addition to higher color gamut, increased brightness, faster response times, and higher resolution than OLEDs.

In some embodiments, the system 800 further adjusts an optical power of the optics block 265 based on the determined vergence depth. The optical power of the optics block 265 may also be adjusted to change a focal distance of the HMD 805 to provide accommodation for the determined vergence depth corresponding to where or what in the displayed portion of the virtual scene the user is looking. Different combinations of display panel selection and optics block 265 configuration can be used to achieve additional available focal distances. The system 800 may select a display panel and optics block 265 configuration that provides a focal distance best matched to the determined vergence depth. In other embodiments, the optics block 265 is omitted from the HMD 805.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A head-mounted display (HMD), comprising:
a first display panel configured to display a first image;
a second display panel positioned in front of the first display panel to at least partially overlap with the first display panel, the second display panel including:
  a display substrate; and
  a plurality of light emitting diodes (LEDs) positioned on the display substrate, the plurality of LEDs configured to display a second image, the display substrate and the plurality of LEDs being transparent for the first image to be visible through the second display panel; and
a controller configured to:
  determine a vergence depth of a user's eyes by tracking positions of the user's eyes;
  associate vergence depths with focal capabilities of the first and second display panels; and
  selectively provide data for displaying an object to the first display panel or the second display panel based on the vergence depth and the focal capabilities of the first and second display panels, the data being provided to the first display panel and not the second display panel responsive to a first determined vergence depth of the user's eyes such that the object is presented on the first display panel and not presented on the second display panel, and the data being provided to the second display panel and not to the first display panel responsive to a second determined vergence depth of the user's eyes such that the object is presented on the second display panel and not presented on the first display panel, the second determined vergence depth being shorter than the first determined vergence depth.

2. The HMD of claim 1, wherein each of the plurality of LEDs comprises:
a LED substrate including a light emitting surface;
an epitaxial layer disposed on another surface of the substrate at an opposite side of the light emitting surface, at least a portion of the epitaxial layer shaped into a mesa structure protruding away from the light emitting surface;
an active layer disposed in the mesa structure to emit the second light to the light emitting surface, at least a portion of the light from the active layer internally reflected at the mesa structure towards the light emitting surface; and
a contact layer disposed on the active layer.

3. The HMD of claim 2, wherein:
the LED substrate includes sapphire or glass;
the epitaxial layer includes gallium nitride (GaN); and
the contact layer includes indium tin oxide (ITO).

4. The HMD of claim 1, wherein the first display panel and the second display panel are separated by between 0.5 and 0.7 diopters.

5. The HMD of claim 1, further comprising:
a third display panel positioned in front of the second display panel and at least partially overlapping with the first display panel and the second display panel, the third display panel including:
a second display substrate; and
a second plurality of LEDs positioned on the second display substrate, the second plurality of LEDs configured to display a third image, the second display substrate and the second plurality of LEDs being transparent for the first image and the second image to be visible through the third display panel.

6. The HMD of claim 1, wherein:
the first display panel includes a first matrix of LEDs aligned in horizontal and vertical directions;
the plurality of LEDs of the second display panel form a second matrix of LEDs aligned in the horizontal and vertical directions; and
the first display panel is positioned relative to the second display panel to spatially offset the first matrix of LEDs and the second matrix of LEDs in at least one of the horizontal direction and the vertical direction.

7. The HMD of claim 1, wherein:
the display substrate and the plurality of LEDs of the second display panel form a first panel portion of the second display panel; and
the second display panel further includes a second panel portion including:
a second display substrate; and
a second plurality of LEDs positioned on the second display substrate, the second plurality of LEDs configured to emit a quasi-collimated second light, the second display substrate and the second plurality of LEDs being transparent for the first light to pass the first light through the second panel portion of the second display panel.

8. The HMD of claim 1, wherein:
the display substrate includes a glass or sapphire substrate including gold or indium tin oxide (ITO) metal trace lines; and
each of the plurality of LEDs includes ITO electrical contacts bonded with the metal trace lines.

9. The HMD of claim 1, wherein:
the first display panel includes a plurality of first panel portions;
the second display panel includes a plurality of second panel portions, each second panel portion is positioned in front of a corresponding first panel portion; and
the HMD further includes a controller configured to selectively provide data for one or more pixels of one of the first panel portions or a corresponding one of the second panel portions.

10. An electronic display, comprising:
a first display panel configured to emit a first light;
a second display panel positioned in front of the first display panel to at least partially overlap with the first display panel, the second display panel including:
a display substrate; and
a plurality of light emitting diodes (LEDs) positioned on the display substrate, the plurality of LEDs configured to emit a second light, the display substrate and the plurality of LEDs being transparent for the first light to pass the first light through the second display panel; and
a controller configured to:
determine a vergence depth of a user's eyes by tracking positions of the user's eyes;
associate vergence depths with focal capabilities of the first and second display panels; and
selectively provide data for displaying an object to the first display panel or the second display panel based on the vergence depth and the focal capabilities of the first and second display panels, the data being provided to the first display panel and not the second display panel responsive to a first determined vergence depth of the user's eyes such that the object is presented on the first display panel and not presented on the second display panel, and the data being provided to the second display panel and not to the first display panel responsive to a second determined vergence depth of the user's eyes such that the object is presented on the second display panel and not presented on the first display panel, the second determined vergence depth being shorter than the first determined vergence depth.

11. The electronic display of claim 10, further comprising a third display panel positioned in front of the second display panel and at least partially overlapping with the first display panel and the second display panel, the third display panel including:
a second display substrate; and
a second plurality of LEDs positioned on the second display substrate, the second plurality of LEDs configured to display a third image, the second display substrate and the second plurality of LEDs being transparent for the first image and the second image to be visible through the third display panel.

12. A method, comprising:
displaying a first image by a first display panel;
displaying a second image by a plurality of light emitting diodes (LEDs) positioned on a display substrate of a second display panel, the second display panel positioned in front of the first display panel to at least partially overlap with the first display panel, the display substrate and the plurality of LEDs being transparent for the first image to be visible through the second display panel;

determining a vergence depth of a user's eyes by tracking positions of the user's eyes;

associating vergence depths with focal capabilities of the first and second display panels; and selectively providing data for displaying an object to the first display panel or the second display panel based on the vergence depth and the focal capabilities of the first and second display panels, the data being provided to the first display panel and not the second display panel responsive to a first determined vergence depth of the user's eyes such that the object is presented on the first display panel and not resented on the second display panel, and the data being provided to the second display panel and not to the first display panel responsive to a second determined vergence depth of the user's eyes such that the object is presented on the second display panel and not presented on the first display panel, the second determined vergence depth being shorter than the first determined vergence depth.

13. The method of claim 12, wherein each of the plurality of LEDs comprises:

a LED substrate including a light emitting surface;

an epitaxial layer disposed on another surface of the substrate at an opposite side of the light emitting surface, at least a portion of the epitaxial layer shaped into a mesa structure protruding away from the light emitting surface;

an active layer disposed in the mesa structure to emit the second light to the light emitting surface, at least a portion of the light from the active layer internally reflected at the mesa structure towards the light emitting surface; and a contact layer disposed on the active layer.

14. The method of claim 13, wherein:

the LED substrate includes sapphire or glass;

the epitaxial layer includes gallium nitride (GaN); and the contact layer includes indium tin oxide (ITO).

15. The method of claim 12, wherein the first display panel and the second display panel are separated by between 0.5 and 0.7 diopters.

16. The method of claim 12, further comprising:

displaying a third image by a second plurality of LEDs positioned on a second display substrate of a third display panel, second display panel positioned in front of the first display panel to at least partially overlap with the first display panel, the second display substrate and the second plurality of LEDs being transparent for the first image and the second image to be visible through the third display panel.

17. The method of claim 12, wherein:

the first display panel includes a first matrix of LEDs aligned in horizontal and vertical directions;

the plurality of LEDs of the second display panel form a second matrix of LEDs aligned in the horizontal and vertical directions; and the first display panel is positioned relative to the second display panel to spatially offset the first matrix of LEDs and the second matrix of LEDs in at least one of the horizontal direction and the vertical direction.

18. The method of claim 12, wherein:

the display substrate includes a glass or sapphire substrate including gold or indium tin oxide (ITO) metal trace lines; and each of the plurality of LEDs includes ITO electrical contacts bonded with the metal trace lines.

* * * * *

UNITED STATES PATENT AND TRADEMARK OFFICE
CERTIFICATE OF CORRECTION

PATENT NO. : 11,112,606 B2
APPLICATION NO. : 16/130973
DATED : September 7, 2021
INVENTOR(S) : Percival et al.

Page 1 of 1

It is certified that error appears in the above-identified patent and that said Letters Patent is hereby corrected as shown below:

In the Claims

In Column 19, Claim 12, Line 12, delete "resented" and insert -- presented --, therefor.

Signed and Sealed this
Twenty-sixth Day of July, 2022

Katherine Kelly Vidal
*Director of the United States Patent and Trademark Office*